FREQUENCY MODULATOR TRANSISTOR CIRCUITS

Filed June 30, 1950

INVENTOR
LESLIE L. KOROS
BY H. L. Newton
ATTORNEY

Patented Jan. 19, 1954 2,666,902

UNITED STATES PATENT OFFICE 2,666,902

FREQUENCY MODULATOR TRANSISTOR CIRCUITS

Leslie L. Koros, Camden, N. J., assignor to Radio Corporation of America, a corporation of Delaware Application June 30, 1950, Serial No. 171,326

12 Claims. (Cl. 332—29)

This invention relates generally to frequency modulation systems, and particlularly relates to a frequency modulator including a semi-conductor circuit.

Various semi-conductor amplifier and oscillator circuits are known in the art. These circuits make use of a semi-conductor device of the type comprising a semi-conducting body having a base electrode, an emitter electrode and a collector electrode in contact therewith. Devices of this character are usually called transistors. The semi-conducting body may consist, for example, of a germanium or silicon crystal. The base electrode is in low-resistance contact with the crystal and may, for example, be a large-area electrode. The emitter and collector electrodes are in rectifying contact with the crystal and may consist of point electrodes, line electrodes or even large-area electrodes. For operation as an amplifier, a bias voltage in the forward direction is impressed between emitter and base while a bias voltage in the reverse direction is applied between collector and base. Assuming that the crystal is of the N type, the emitter should be positive with respect to the base while the collector should be negative with respect to the base. If the crystal is of the P type, the potentials must be reversed.

In accordance with the present invention, a transistor circuit is used in a frequency modulation system. Frequency modulation systems are well known in the art. Thus, a vacuum tube may be connected to simulate a reactance which may be coupled across the tank circuit of an oscillator. Variation of the reactance represented by the tube will vary the frequency of the wave developed by the oscillator. It has also been suggested to utilize the variable output resistance of a cathode follower vacuum tube circuit to produce reactance variations at the end of an artificial transmission line which is coupled in turn to the tank circuit of the oscillator. In another frequency oscillator circuit a detuned circuit is loaded by a variable resistance, the circuit being coupled inductively to the oscillator tank circuit. In both methods, the variable internal plate resistance of a vacuum tube is utilized for modulating the frequency of the tank circuit of an oscillator. Furthermore, resistance transforming means must be employed to couple variable reactive elements into the oscillator tank circuit. These vacuum tube circuits have the disadvantage that they are fairly complicated. Furthermore, the frequency deviation which may be obtained in this manner has a comparatively small linear range.

It is accordingly the principal object of the present invention to provide a frequency modulation system including a semi-conductor circuit for modulating the frequency of a wave over a substantially linear range in accordance with a modulation signal while the undesired, simultaneously developed amplitude variation of the wave is negligible.

A further object of the invention is to provide a relatively simple and novel transistor circuit for varying or modulating the frequency of a tuned circuit or the frequency of a wave developed by an oscillator circuit whereby a large frequency deviation may be obtained which is a function of the modulation signal and which has a wide portion with a linear relationship between the amplitude of the modulation signal and the resulting frequency deviation of the wave.

Another object of the invention is to provide an improved frequency modulation system including essentially a semi-conductor circuit wherein a large variation of the equivalent resistance and in some cases an additional variation of the equivalent reactance of the semi-conductor device is produced in response to an impressed signal, thereby to vary directly the frequency of a circuit over a range having an extended linear portion.

Still a further object of the invention is to provide a semi-conductor frequency modulation system which requires a relatively small modulation signal power and a small direct current power and consequently a smaller number of amplifier stages between the modulation signal sources such as a microphone and the modulator input.

In accordance with the present invention, it has been found that the equivalent collector impedance of a semi-conductor circuit is a function of the applied emitter voltage and consequently of the emitter current. The equivalent collector impedance is the impedance which appears looking into the collector electrode, that is, between the collector and the base. This impedance has a predominantly resistive component and a comparatively small reactive component. It has been found that variation of the equivalent collector impedance with variation of the emitter bias voltage may be utilized to vary or modulate the frequency of a tuned circuit. This tuned circuit may, for example, be the frequency-determining circuit or tank circuit of an oscillator. Such a circuit is coupled to the collector electrode. This coupling may be capacitive or inductive. Thus, the oscillator tank circuit may be coupled to the collector by a capacitor or by an inductor. Alternatively, an inductor provided in the collector circuit may be magnetically coupled to the oscillator tank circuit. The modulation signal is impressed between the emitter and base. The collector circuit may include a source of potential such as a battery and an inductor connected between base and collector. The inductor presents a low impedance to the modulation signal which accordingly does not appear in the collector output circuit. However, the inductor presents a large impedance to alternating currents at the frequency of the oscillator tank circuit. The semi-conductor circuit may be considered essentially a variable resistance which is coupled across the tank circuit, for example, by a capacitor or by an inductor. Accordingly, the capacitive or inductive current across the oscillator tank circuit is a function of the resistance represented by the semi-conductor circuit.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1, 2, 3, 4, 5, 6:
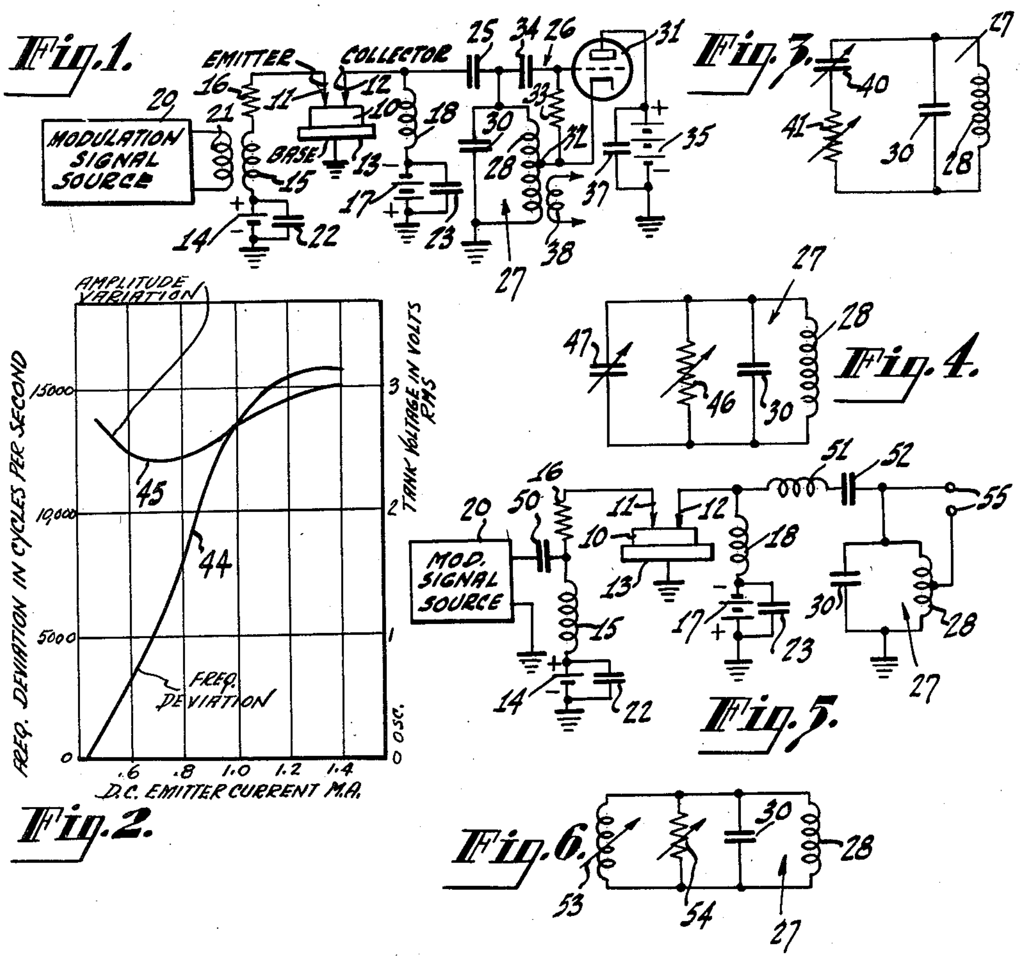
Figure 1 is a circuit diagram of a frequency modulation system including an oscillator circuit and a semi-conductor circuit embodying the present invention.
Figure 2 is a graph illustrating the frequency deviation and the amplitude modulation of the wave developed by the oscillator circuit of Figure 1.
Figure 3 is an equivalent circuit diagram of the frequency modulation system of Figure 1.
Figure 4 is a modified equivalent circuit diagram of the frequency modulation system of Figure 1.
Figure 5 is a circuit diagram of a frequency modulation system in accordance with the invention, wherein inductive coupling is employed between the semi-conductor circuit and the oscillator circuit.
Figure 6 is an equivalent circuit diagram of the frequency modulation system of Figure 5.

Referring now to the drawing, in which like components have been designated by the same reference numerals throughout the figures, and particularly to Figure 1, there is illustrated a frequency modulation system in accordance with the invention comprising a semi-conductor device. The semi-conductor device includes a body 10 of semi-conducting material which may consist, for example, of germanium or silicon containing a small but sufficient number of atomic impurities centers or lattice imperfections as commonly employed for best results in transistors. Germanium is a preferred material for body 10 and may be prepared so as to be an N-type semi-conductor as is well known. The surface of body 10 may be polished and etched in a conventional manner.

Emitter electrode 11, collector electrode 12 and base electrode 13 are in contact with body 10. Emitter electrode 11 and collector electrode 12 are in rectifying contact with the body and may be point contacts or line contacts. Base electrode 13 is in a low-resistance contact with body 10 and may be a large-area electrode such as a suitable piece of brass soldered to body 10.

For operation as an amplifier, a forward bias voltage is impressed between emitter 11 and base 13 while a bias voltage in the reverse direction is impressed between collector 12 and base 13. Assuming that body 10 consists of an N-type crystal, emitter 11 should be positive with respect to base 13 while collector 12 should be negative with respect to the base. If body 10 consists of a P-type crystal, the potentials must be reversed. For the purpose of applying a bias voltage in the forward direction between emitter 11 and base 13 there may be provided a source of potential such as battery 14 having its negative terminal grounded. The positive terminal of battery 14 is connected to emitter 11 through inductor 15 and resistor 16. The provision of resistor 16 is not required for the operation of the circuit. Base electrode 13 is grounded as shown. Battery 17 is provided for the purpose of applying a bias voltage in the reverse direction between collector 12 and base 13. To this end the positive terminal of battery 17 is grounded while its negative terminal is connected to collector 12 through choke coil 18.

In accordance with the present invention, a modulation signal source indicated at 20 is connected to impress a modulation signal between emitter 11 and base 13. The modulation signal may, for example, be an audio signal or a direct current voltage as used for automatic frequency control. Thus, modulation signal source 20 may have an output coil 21 inductively coupled to coil 15 in the emitter circuit. Accordingly, the modulation signal is impressed on emitter 11 through linearizing resistor 16, the purpose of which will be explained hereinafter. Choke coil 18 has such an inductance that it presents a low impedance to the modulation signal which is thus by-passed to ground in the collector circuit. The resistance of choke coil 18 should be low and should not be substantially larger than the equivalent collector resistance. Battery 14 may be by-passed by capacitor 22 while battery 17 may be by-passed by capacitor 23 for signal frequency currents.

The frequency modulation circuit thus described is coupled, for example, by coupling capacitor 25 to an oscillator circuit generally indicated at 26. Oscillator circuit 26 includes a frequency-determining circuit such, for example, as tank circuit 27 consisting of inductor 28 and capacitor 30. The oscillator circuit further includes a vacuum tube triode 31. Tube 31 may be a tetrode, pentode, a transistor, or any other oscillation generator. The oscillator circuit may also be of the RC type in which case frequency-determining circuit 27 may be replaced by an RC phasing feedback circuit. The cathode of oscillator tube 31 is connected to tap 32 on coil 28. Grid leak resistor 33 is connected between the control grid and the cathode of oscillator tube 31. Tank circuit 27 has one terminal connected to ground while its other terminal is connected to the control grid of oscillator tube 31 by blocking capacitor 34 which prevents the grid current from flowing through inductor 28. The anode of oscillator tube 31 is supplied with a suitable anode voltage by battery 35 having its negative terminal grounded. Battery 35 may be by-passed for alternating currents at the frequency of the oscillator by capacitor 37. An output wave may be derived from output coil 38 which is magnetically coupled to inductor 28 or from any two points of the tank circuit 27 by direct coupling. One terminal of tank circuit 27 is also connected to coupling capacitor 25.

Oscillator circuit 26 is a conventional Hartley oscillator and its operation is so well known that further explanation is not necessary here. The frequency of the wave developed in tank circuit 27 is a function of the modulation signal developed by source 20. Thus, the modulation signal varies or modulates the effective emitter bias voltage and thereby varies the emitter current. In accordance with the present invention it has been found that the equivalent collector impedance, that is, the impedance looking into collector electrode 12 is a function of the emitter voltage or the emitter current. It has also been found that the equivalent collector impedance is complex and includes a preponderant resistive component and a small reactive component which may be inductive or capacitive or even at some similar current value may disappear, depending upon the electrical characteristics of the particular semi-conductor device.

The modulation signal currents are substantially short-circuited by choke coil 18 and battery 17 which, as pointed out previously, present a low impedance to the modulation signal. On the other hand, choke coil 18 presents a large impedance to the oscillatory currents at the frequency determined by tank circuit 27. A resistor of suitable resistance may be provided in series with battery 17 and in shunt with capacitor 23 to prevent collector 12 from acting as a biased detector for the wave in tank circuit 27.

Emitter resistor 16 serves as a linearizing resistor and reduces distortion which may be caused by a curved input voltage-output current characteristic. As disclosed in a copending application of R. F. Schwartz, Serial No. 170,601, filed on June 27, 1950, entitled "Amplifiers With High Undistorted Output" and assigned to the assignee of this application, this may be due in part to a small variation of the equivalent emitter resistance, that is, the resistance looking into emitter electrode 11. It has been found that the provision of linearizing resistor 16 in series with the modulation source will reduce signal distortion.

Referring now to Figure 3, there is illustrated an equivalent circuit of the frequency modulation system of the invention. Tank circuit 27 includes capacitor 30 and inductor 28. Capacitor 40 and resistor 41 connected in series across tank circuit 27 represent coupling capacitor 25 and the variable impedance of the semi-conductor device. Thus, variable capacitor 40 includes the fixed capacitance of coupling capacitor 25 and the variable reactance which appears looking into collector electrode 12. Variable resistor 41 represents the variable resistance which appears looking into the collector electrode. Accordingly, coupling capacitor 40 draws more or less capacitive current from the tank circuit 27 in accordance with the instantaneous value of the equivalent collector resistance. Oscillator tank 27 is loaded by a variable resistor 41 through coupling capacitor 40.

The variation of the resistance of resistor 41 will cause a certain amount of amplitude variation. However, this amplitude variation may be kept below any desired value by selecting the oscillator tank capacitor 30 so that it has a low reactance. On the other hand, in order to produce a large amount of frequency deviation for a given variation of resistor 41 and a given capacitance of capacitor 40 in Figure 3 or 25 in Figure 1 respectively the reactance of tank capacitor 30 should be large. However, a sound compromise is possible between these contradictory requirements.

By way of example, the tank circuit 27 may have a resonant frequency of 1.04 mc. (megacycles). Capacitor 30 of tank circuit 27 may have a capacitance of 1,000 mmf. (micromicrofarads) while the capacitance of coupling capacitor 25 may be 47 mmf. In general, the capacitance of coupling capacitor 25 should not be substantially more than one tenth the capacitance of capacitor 30 of tank circuit 27 if a small amplitude modulation is desired. The inductance of coil 18 may amount to 5 millihenries and the resistance of linearizing resistor may be 510 ohms. Bypass capacitors 22 and 23 should have a low reactance compared with the resistance of linearizing resistance 16 and with the equivalent emitter and collector impedances.

Figure 7:
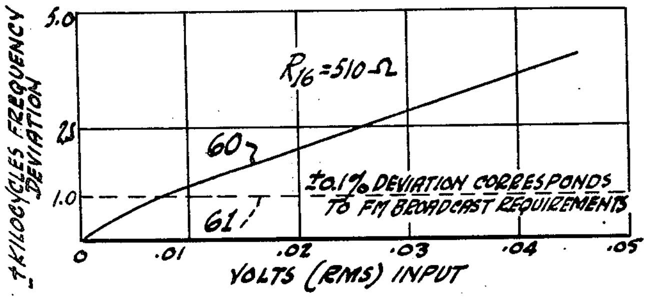
Figure 7 is a graph illustrating the dynamic frequency deviation with respect to the modulating voltage.

With these circuit constants and with the frequency modulation system of Figure 1 the curves shown in Figure 2 have been obtained. Thus, curve 44 illustrates the static frequency deviation of tank circuit 27 with respect to the emitter current in milliamperes (see the left hand margin of Figure 2). Curve 45 indicates the amplitude variation of the wave developed in tank circuit 27 (see the right hand margin of Figure 2). The amplitude variation is given in volts rms. The mean frequency of tank circuit 27 is 1.0306 mc. and the total frequency deviation over the linear portion of curve 44 is ±3.4 kc. (kilocycles) corresponding to an emitter current between .75 and .95 milliamperes. Over this range of emitter current variation the amplitude variation of the wave developed in tank circuit 27 amounts to 4.2 per cent which is a reasonable low value. Figure 7 illustrates the dynamic frequency deviation curve 60 with respect to the modulation signal. Dotted line 61 indicates the frequency deviation required for broadcast purposes.

The frequency-modulated carrier wave developed in tank circuit 27 and obtained from output coil 38 may be utilized at that frequency. Alternatively, the frequency of the frequency-modulated carrier wave may be multiplied which will increase the frequency deviation as is well known. An amplitude modulation in the order of magnitude of 4 per cent will be substantially suppressed by the stages used for the frequency multiplication. The linear frequency deviation obtained with the frequency modulation system of the invention is larger than is required for a frequency-modulated broadcast wave.

The reactance variation of the equivalent collector impedance may help to increase the frequency deviation produced in the frequency modulation system of the invention. Thus, if the equivalent collector reactance is capacitive and when the capacitance and the resistance decrease simultaneously, the semi-conductor circuit produces a larger frequency deviation. However, if the capacitance increases while the resistance decreases, the frequency deviation will be reduced. If the equivalent collector reactance is inductive and increases with decreasing resistance, the frequency deviation increases and vice versa.

It has been found that the equivalent collector resistance may vary between 600 and 5,000 ohms, while the emitter current is varied by about 1 milliampere. Since the equivalent emitter resistance is of the order of 200 ohms only a small input power of the modulation signal is required to develop the relatively large change of the equivalent collector resistance. This is a unique feature of the semi-conductor circuit of the invention which makes it particularly useful as a frequency modulator.

The equivalent circuit of Figure 3 may also be transformed into the equivalent circuit of Figure 4 as will be evident. In the equivalent circuit of Figure 4, tank circuit 27 is shunted by variable resistor 46 and variable capacitor 47. Capacitor 47 includes again the fixed capacitance of coupling capacitor 25 and the variable equivalent collector reactance while resistor 46 includes the variable collector resistance. The circuit of Figure 4 corresponds to the values of the resistance and reactance which may readily be measured for a modulator, for example, with a Q meter.

The circuit of Figure 5 illustrates a modification of the frequency modulation system of the invention. Modulation source 20 is coupled by capacitor 50 to the junction point between resistor 16 and coil 15. In other words, the source is again connected in series with linearizing resistor 16. Tank circuit 17 is coupled to the semi-conductor circuit by inductor 51 and capacitor 52 arranged in series. The reactance of capacitor 52 is low compared to that of inductor 51. Accordingly, the semi-conductor circuit is inductively coupled to tank circuit 27 as illustrated in Figure 6 where inductor 53 and resistor 54 are shunted across tank circuit 27. Resistor 54 again represents the equivalent collector resistance. Inductor 53 represents the fixed inductance of inductor 51 in series with capacitor 52 and the variable equivalent collector reactance. The circuit of Figure 5 otherwise operates in the same manner as the circuit of Figure 1. A device such as, for example, a triode, a pentode, a transistor which represents with tank circuit 27 an oscillator, may be connected to output terminals 55 and a ground return.

There has thus been disclosed a frequency modulation system including a semi-conductor circuit. The frequency deviation may be produced over a comparatively large linear range and requires a small driving power. The frequency deviation is caused by a variation of the equivalent collector resistance which may be aided by a simultaneous collector reactance variation. The circuit is comparatively simple and the amplitude variation may be kept very small.

What is claimed is:

1. A circuit for varying the frequency of a tuned circuit comprising a semi-conductor device including a semi-conducting body, a base electrode, an emitter electrode and a collector electrode in contact with said body, means for applying operating potentials to said electrodes including a source of potential and an impedance element serially connected between said base and collector electrodes, means for applying a signal effectively between said emitter and base electrodes, a tuned circuit, and means connected serially with the collector-base electrode path of said semi-conductor device for coupling said tuned circuit to said collector electrode, whereby said signal source varies the frequency of said tuned circuit in accordance with said signal.

2. A circuit for modulating the frequency of a tuned circuit comprising a semi-conductor device including a semi-conducting body, a base electrode, an emitter electrode and a collector electrode in contact with said body, means for applying operating potentials to said electrodes including a source of potential and an inductor serially connected between said base and collector electrodes, means for applying a modulation signal effectively between said emitter and base electrodes, a tuned circuit, and means connected serially with the collector-base electrode path of said semi-conductor device for coupling said tuned circuit to said collector electrode, whereby said modulation source modulates the frequency of said tuned circuit in accordance with said modulation signal.

3. A circuit for modulating the frequency of a tuned circuit comprising a semi-conductor device including a semi-conducting body, a base electrode, an emitter electrode and a collector electrode in contact with said body, means for applying a bias potential in the forward direction between said emitter and base electrodes, means for applying a bias potential in the reverse direction between said collector and base electrodes including a source of potential and an inductor serially connected between said collector and base electrodes, means for applying a modulation signal effectively between said emitter and base electrodes, a tuned circuit, and reactive means connected serially with the base-collector electrode path of said semi-conductor device for coupling said tuned circuit to said collector electrode, whereby said modulation source modulates the frequency of said tuned circuit over a range having a substantially linear portion in accordance with said modulation signal.

4. A frequency modulation system comprising an oscillator having a frequency-determining circuit, a semi-conductor device including a semi-conducting body, a base electrode, an emitter electrode and a collector electrode in contact with said body, means for applying a bias voltage in the forward direction between said emitter and base electrodes, means for applying a bias voltage in the reverse direction between said collector and base electrodes including an impedance element connected between said collector and base electrodes, said impedance element having a resistance which is substantially not larger than the resistance which appears looking into said collector electrode, reactive means connected serially with the base-collector electrode path of said semi-conductor device for coupling said frequency-determining circuit to said collector electrode, and a source of modulation signal connected effectively between said emitter and base electrodes, thereby to vary the frequency of said frequency-determining circuit as a function of said modulation signal.

5. A frequency modulation system comprising an oscillator having a frequency determining circuit, a semi-conductor device including a semi-conducting body, a base electrode, an emitter electrode and a collector electrode in contact with said body, means for applying a bias voltage in the forward direction between said emitter and base electrodes, means for applying a bias voltage in the reverse direction between said collector and base electrodes including an inductor connected between said collector and base electrodes, reactive means connected serially between said frequency determining circuit and said collector electrode for coupling said frequency determining circuit to said collector electrode, and a source of modulation signal connected effectively between said emitter and base electrodes, thereby to vary the frequency of said frequency-determining circuit as a function of said modulation signal.

6. A frequency modulation system comprising an oscillator having a resonant circuit, a semi-conductor device including a semi-conducting body, a base electrode, an emitter electrode and a collector electrode in contact with said body, means for applying a bias voltage in the forward direction between said emitter and base electrodes, means for applying a bias voltage in the reverse direction between said collector and base electrodes including a source of voltage and an inductor serially connected between said collector and base electrodes, reactive means connected serially between said resonant circuit and the base-collector electrode path of said semi-conductor device for reactively coupling said resonant circuit to said collector electrode, and a source of modulation signal connected effectively between said emitter and base electrodes thereby to vary the frequency of the wave developed by said oscillator in accordance with said modulation signal.

7. A system as defined in claim 6 wherein said reactive means for coupling comprises a capacitor connected between said resonant circuit and said collector electrode and having a capacitance which is small compared to the capacitance of said resonant circuit.

8. A system as defined in claim 6 wherein said reactive means for coupling comprises a capacitor and an inductor connected serially between said collector electrode and said resonant circuit.

9. A system as defined in claim 6 wherein said reactive means for coupling comprises an inductive coupling between said inductor and said resonant circuit.

10. A system as defined in claim 6 wherein said inductor presents a low impedance to said modulation signal.

11. A frequency modulation system comprising an oscillator including a frequency-determining resonant circuit, a semi-conductor device including a semi-conducting body, a base electrode, an emitter electrode and a collector electrode in contact with said body, means connecting said base electrode to a point of substantially fixed potential, a first source of potential and a linearizing resistor connected serially between said base and emitter electrodes for applying a bias voltage in the forward direction between said electrodes, a source of modulation signal connected effectively in series between said first source of potential and said resistor, a second source of potential and an inductor connected serially between said collector and base electrodes for applying a bias voltage in the reverse direction between said electrodes, said inductor presenting a small reactance to modulation signal currents, and means for coupling said resonant circuit between said collector and base electrodes, thereby to modulate the apparent resistance and reactance connected across said resonant circuit in accordance with said modulation signal.

12. A frequency modulation system comprising an oscillator including a frequency-determining resonant circuit, a semi-conductor device including a semi-conducting body, a base electrode, an emitter electrode and a collector electrode in contact with said body, means connecting said base electrode to a point of substantially fixed potential, a first source of potential and a linearizing resistor connected serially between said base and emitter electrodes for applying a bias voltage in the forward direction between said electrodes, a source of modulation signal connected effectively in series between said first source of potential and said resistor, a second source of potential and an inductor connected serially between said collector and base electrodes for applying a bias voltage in the reverse direction between said electrodes, said inductor presenting a small reactance to modulation signal currents, and a capacitor connected between said collector electrode and said resonant circuit for reactively coupling said resonant circuit between said collector and base electrodes, thereby to modulate the apparent resistance and reactance connected across said resonant circuit in accordance with said modulation signal for modulating the frequency of the wave developed by said oscillator over a range having an extended substantially linear portion.

LESLIE L. KOROS.

References Cited in the file of this patent

UNITED STATES PATENTS

| Number | Name | Date |
|---|---|---|
| 2,000,584 | Fichandler | May 7, 1935 |
| 2,033,231 | Crosby | Mar. 10, 1936 |
| 2,279,659 | Crosby | Apr. 14, 1942 |
| 2,486,776 | Barney | Nov. 1, 1949 |
| 2,533,001 | Eberhard | Dec. 5, 1950 |
| 2,570,938 | Goodrich, Jr. | Oct. 9, 1951 |
| 2,570,939 | Goodrich, Jr. | Oct. 9, 1951 |
| 2,585,078 | Barney | Feb. 12, 1952 |